US012805227B2

(12) United States Patent
Milanesi et al.

(10) Patent No.: US 12,805,227 B2
(45) Date of Patent: Nov. 17, 2026

(54) METHOD FOR MAKING A HIGH ASPECT RATIO TRENCH

(71) Applicant: STMicroelectronics International N.V., Geneva (CH)

(72) Inventors: Francesca Milanesi, Milan (IT); Marcello Ravasio, Olgiate Molgora (IT); Giovanni Feliciani, Bollate (IT)

(73) Assignee: STMicroelectronics International N.V., Geneva (CH)

( * ) Notice: Subject to any disclaimer, the term of this patent is extended or adjusted under 35 U.S.C. 154(b) by 279 days.

(21) Appl. No.: 18/620,041

(22) Filed: Mar. 28, 2024

(65) Prior Publication Data

US 2025/0308914 A1 Oct. 2, 2025

(51) Int. Cl.
*H10P 50/24* (2026.01)
*H10W 20/00* (2026.01)

(52) U.S. Cl.
CPC ......... *H10P 50/244* (2026.01); *H10W 20/056* (2026.01); *H10W 20/076* (2026.01)

(58) Field of Classification Search
CPC .. H10P 50/244; H10P 50/242; H10W 20/056; H10W 20/076
USPC .................................................. 438/706–714
See application file for complete search history.

(56) References Cited

U.S. PATENT DOCUMENTS

| | | | | |
|---|---|---|---|---|
| 6,284,666 | B1 * | 9/2001 | Naeem | H10P 50/692 257/E21.232 |
| 8,871,105 | B2 | 10/2014 | Winniczek et al. | |
| 2015/0021745 | A1 | 1/2015 | Hawke et al. | |
| 2015/0069581 | A1 | 3/2015 | Chang et al. | |
| 2018/0358227 | A1 | 12/2018 | Raley et al. | |
| 2020/0013631 | A1 | 1/2020 | Borna Tutuc et al. | |
| 2021/0265487 | A1 * | 8/2021 | Wang | H10D 64/017 |
| 2022/0102155 | A1 | 3/2022 | Chang et al. | |
| 2022/0165610 | A1 | 5/2022 | Yu et al. | |
| 2022/0328656 | A1 * | 10/2022 | Wang | H10D 30/024 |
| 2023/0009146 | A1 * | 1/2023 | Jo | H10P 50/244 |

FOREIGN PATENT DOCUMENTS

| | | | |
|---|---|---|---|
| JP | 2010103358 A | * | 5/2010 |
| JP | 2013206991 A | * | 10/2013 |
| JP | 2014013821 A | | 1/2014 |

* cited by examiner

*Primary Examiner* — Duy Vu N Deo
(74) *Attorney, Agent, or Firm* — Crowe & Dunlevy LLC

(57) ABSTRACT

A process is provided for forming a trench extending into the upper surface of a semiconductor substrate. The process includes a first etch phase utilizing repeated alternating etching and deposition cycles to open a first trench in the semiconductor substrate. The first trench has a first depth. The process further includes a second etch phase, subsequent to the first etch phase, utilizing a reactive ion etch to open a second trench, extending from a bottom of the first trench, in the semiconductor substrate. The second trench has a second depth.

25 Claims, 6 Drawing Sheets

METHOD FOR MAKING A HIGH ASPECT RATIO TRENCH

TECHNICAL FIELD

The present invention generally relates to a process for the formation of a high aspect ratio trench in a semiconductor substrate.

BACKGROUND

The rapid alternating parameters (RAP) process or the Bosch process are methods well known to those skilled in the art for performing deep silicon etching in the formation of trenches. These processes are characterized by the repeated use of alternating etching and deposition cycles. A noted drawback of the use of these processes is the formation of "scallops" 10 in the sidewalls of the etched trench 12 as shown in FIG. 1 (where reference 14 is a semiconductor, for example silicon, substrate, and reference 16 is a hard mask with an opening defining the location wherein the trench is to be etched). These scallops 10 are a direct result of the repeated alternating etching and deposition cycles. For trenches 12 having a relatively lower aspect ratio, the presence of the trench sidewall surface roughness defined by the scalloped features is of little concern. However, in the case where a relatively higher aspect ratio trench is desired, for example where the aspect ratio is greater than or equal to 10:1 (depth:width), the scallops 10 can adversely affect the ability to completely fill the trench 12 (for example, with a polysilicon material) as shown in FIG. 2 where the presence of scalloped sidewall surface features in a high aspect ratio trench (with trench width W) blocks complete filling of the trench leaving "keyhole" regions devoid of the polysilicon fill.

There are a number of known solutions for addressing the scalloped sidewall surface roughness issue. One solution involves bombarding the trench 12 with a molecular beam where molecules are directed on an axis parallel to the trench sidewall to reduce the surface roughness of the scalloped features (see, United States Patent Publication No. 2015/0069581, incorporated herein by reference). It is also known to use an $H_2$ annealing process to smooth the scalloped features, but this solution comes with a very high cost. Another option is to utilize a double hard mask etch, but this also has a high cost. Yet another option is the use of a selective etch for scallop removal (see, U.S. Pat. No. 8,871,105, incorporated herein by reference).

There is a need in the art to provide an improved and cost-effective method for performing deep silicon etching in the formation of trenches having relatively high aspect ratios.

SUMMARY

In an embodiment, a method comprises: providing a semiconductor substrate having an upper surface; and forming a trench extending into the semiconductor substrate from the upper surface. The process for forming the trench comprises: in a first etch phase, performing a plurality of repeated alternating etching and deposition cycles to open a first trench in the semiconductor substrate, said first trench having a first depth; and in a second etch phase, subsequent to the first etch phase, performing a reactive ion etch to open a second trench, extending from a bottom of the first trench, in the semiconductor substrate, said second trench having a second depth.

In an embodiment, the repeated alternating etching and deposition cycles of the first etch phase are part of a Bosch etching process or a rapid alternating parameters (RAP) etching process for trench formation.

In an embodiment, performing the reactive ion etch comprises: supplying a noble gas (such as Ar, for example) in a gas mixture for the reactive ion etch; and applying a negative bias voltage (such as 200-400 Volts, for example) to the semiconductor substrate during the reactive ion etch.

In an embodiment, a method is presented for manufacturing an electronic device comprising a semiconductor substrate having an upper surface and a first trench and second trench extending into the semiconductor substrate from the upper surface, wherein the second trench has a second depth in the semiconductor substrate greater than a first depth of the first trench in the semiconductor substrate. The method comprises: providing the semiconductor substrate; in a first etch phase, performing a plurality of repeated alternating etching and deposition cycles to open a respective first portion of each of the first and second trenches, said respective first portion having a respective first depth; in a second etch phase, subsequent to the first etch phase, performing a reactive ion etch to open a respective second portion of each of the first and second trenches, extending from a bottom of the respective first portion, said respective second portion having a respective second depth; lining sidewalls and a bottom of each of the first and second trenches with an insulating layer; removing the insulating layer from the bottom of the second trench, while leaving the insulating layer in place on the bottom of the first trench; and then, filling each of the first and second trenches with a conductive material.

BRIEF DESCRIPTION OF THE DRAWINGS

For a better understanding of the embodiments, reference will now be made by way of example only to the accompanying figures in which.

DETAILED DESCRIPTION

Reference is made to FIGS. 3A-3E which illustrate steps in process for forming and filling a high aspect ratio trench.

Figure 1:
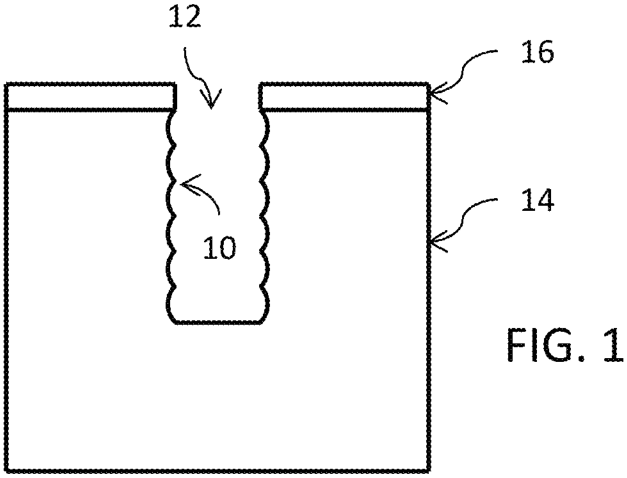
FIG. 1 illustrates a cross section of a trench formed using a Bosch process showing the presence of scalloped sidewall surface roughness.
Figure 2:
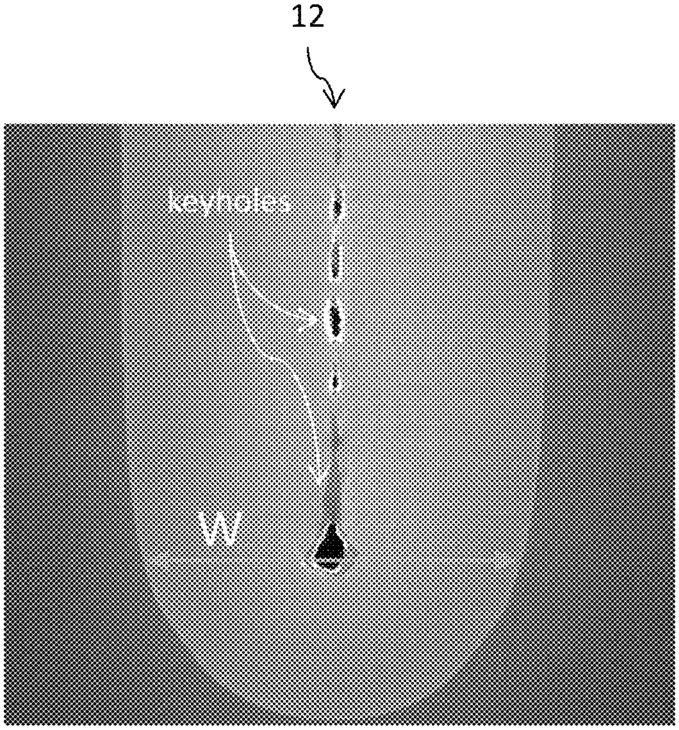
FIG. 2 is a SEM image of a bottom of a high aspect ratio trench formed by the Bosch process and incompletely filled with a polysilicon material due the presence of scalloped sidewall surface roughness.
Figure 3A:
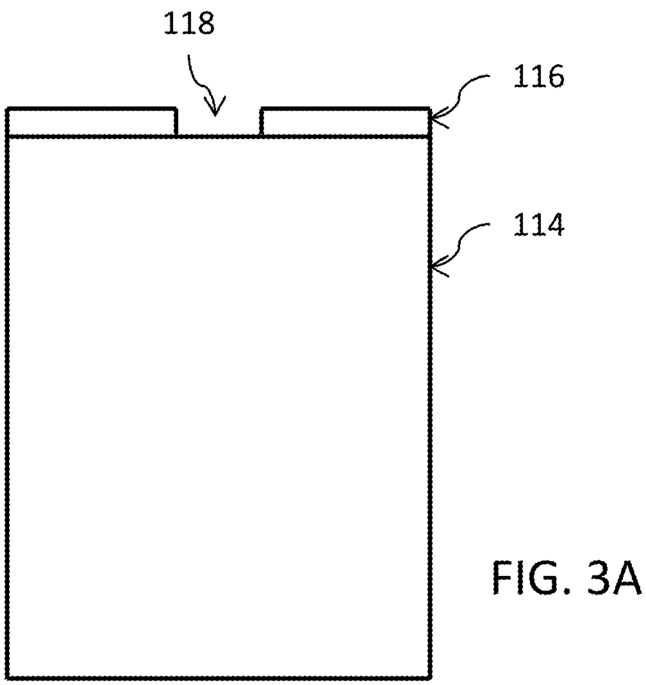
FIGS. 3A-3E illustrate steps in process for forming and filling a high aspect ratio trench.

FIG. 3A—a hard mask 116 is formed on the upper surface of a semiconductor (for example, silicon) substrate 114 and patterned to include a mask opening 118 at the location where it is desired to form a trench.

Figure 3B:
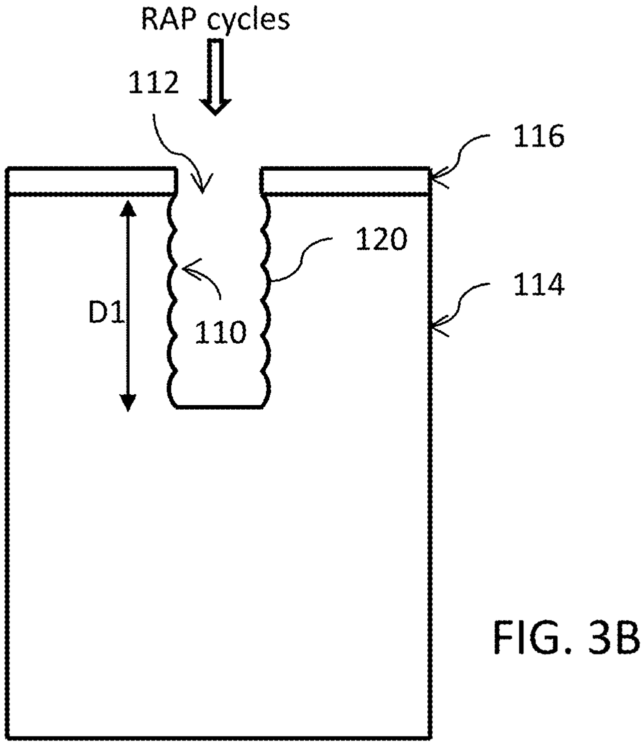

FIG. 3B—using a rapid alternating parameters (RAP) etch process, or a Bosch etch process, as is well known to those skilled in the art, repeated alternating etching and deposition cycles are performed in a first etch phase to open a first trench 112 (i.e., a first part or portion of the overall trench) in the substrate 114 to a first depth D1. It is noted that the RAP/Bosch etch process produces a trench sidewall surface roughness defined by scalloped features 110.

As an example of the RAP/Bosch process, the etching cycle may utilize a fluorine-based plasma (such as a plasma based on $SF_6$) to etch a recess in the substrate. As an example, an $SF_6$ gas with a flow rate of between 10-1000 sccm, a plasma power of 100-5000 watts, a process pressure of 5-500 mTorr, and an etch time of 0.1-10 seconds may be used for the etching cycle. The depth of the recess formed by the etching cycle is controlled by introducing the $SF_6$ gas in the etching chamber at a controlled flow rate and pressure over time. The etching cycle removes a portion of the semiconductor material of the substrate 114 to form the recess in a generally isotropic manner. Further to the example of the RAP/Bosch process, the deposition cycle may utilize fluorocarbon-based plasma (such as a plasma based on $C_4F_8$) to deposit a thin passivation layer 120 (made of C, F, Si, and or O; e.g., made of a polymer material) on sidewalls of the etched recess. It will be noted that, because of considerations of scale, details of the thin passivation layer 120 are not explicitly show in FIG. 3B. As an example, a $C_4F_8$ gas can be used to form the liner using a gas rate of 10-1000 sccm, a plasma power of 100-5000 watts, a process pressure of 5-500 mTorr and a deposition time of 0.1-10 seconds. To promote a uniform deposition of the thin passivation layer, a bias voltage at 0 Volts may be applied to the substrate 124. The passivation layer will, with respect to the next etching cycle, inhibit against lateral etching as compared to vertical etching so that the next etched recess in the substrate extends downwardly into the substrate from the bottom of the previous etched recess to extend the depth of the trench being formed.

The cycle of the RAP including the fluorine-based plasma to etch the recess (etching) and the fluorocarbon-based plasma to line the recess with the passivation layer (deposition) is repeated over and over again until the trench 112 is opened in the substrate 114 to the first depth D1 (as shown by structure illustrated in FIG. 3B).

The scalloped features 110 of the trench 112 sidewall surface roughness arise as a direct consequence of the repeated isotropic fluorine-based plasma etch cycles producing etch recesses where the sidewalls of previous etched recesses are covered by the passivation layer deposited in each of the repeated fluorocarbon-based plasma deposition cycles.

The recipe provided above for the RAP/Bosch process to produce the trench 112 will be understood as just one, non-limiting, example of the process recipe. As an alternative, the etching cycle may utilize a $Cl_2$, $NF_3$ or $CF_4$ plasma. As an alternative, the deposition cycle may utilize a carbon containing source gas such as $CH_2F_2$, $CHF_3$, or $C_4F_6$.

Figure 3C:
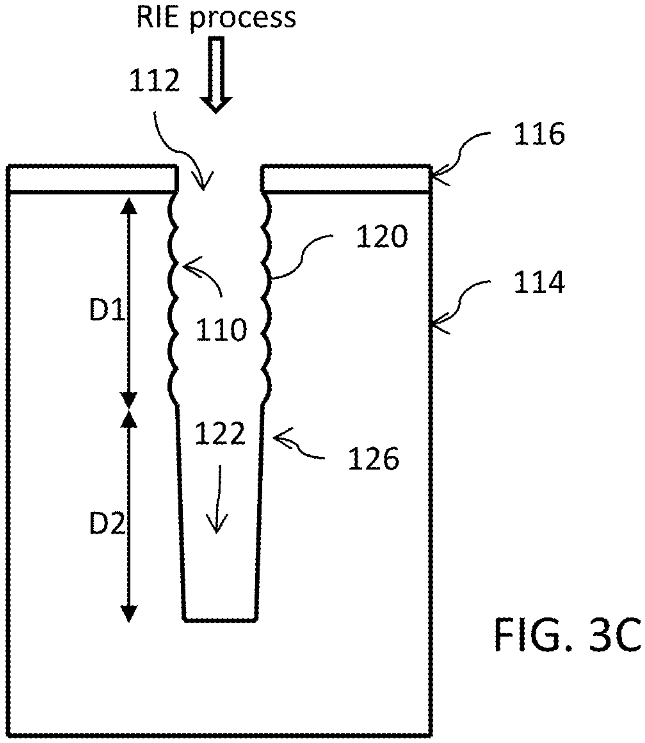

FIG. 3C—using a reactive ion etch (RIE) process in a second etch phase (subsequent to the first etch phase), a second trench 122 (i.e., a second part or portion of the overall trench) is opened (extending from the bottom of the RAP/Bosch process formed first trench 112) in the substrate 114 to a second depth D2. The etch provided by the RIE process is anisotropic. The overall trench 126 produced by the RAP/Bosch process and RIE process has a depth of D1+D2. It will be noted that the anisotropic RIE produces the second trench 122 with a substantially uniform (i.e., smooth) trench sidewall surface roughness.

As an example of the RIE process, the etching utilizes a gas mixture that includes $SF_6$, $O_2$ and a noble gas such as, for example, Ar. As an example, the gas mixture may comprise $SF_6$ at a gas rate in the range of 70-110 sccm (more preferably 80-100 sccm), $O_2$ at a gas rate in the range of 50-85 sccm (more preferably 60-75 sccm), and Ar at a gas rate in the range of 30-60 sccm. This would provide a gas mixture that is, for example, 35-55% $SF_6$, 25-40% $O_2$ and 15-30% Ar. A process pressure in a range of 20-60 mTorr (more preferably 30-50 mTorr or, for example, at a pressure of about 35 mTorr) is used. During the RIE process, a negative bias voltage is be applied to the substrate 124. As an example, the negative bias voltage may be in the range of 200-400 Volts (which corresponds to a bias power greater than about 100 watts, preferably greater than about 120 watts, and preferably less than about 160 watts). A plasma power (i.e., Top Coil Power (TCP) corresponding to the power at the top of the camera) for the RIE process may, for example, be greater than about 700 watts and preferably less than about 900 watts.

It will be noted that the RIE process may include an initial phase for stabilization where the gas flow and mixture is provided to the etch chamber but no bias voltage/power or plasma power is applied. This initial phase allows for a homogenous and complete filling of the etch chamber to have a controlled etching once the power is turned on.

Figure 3D:
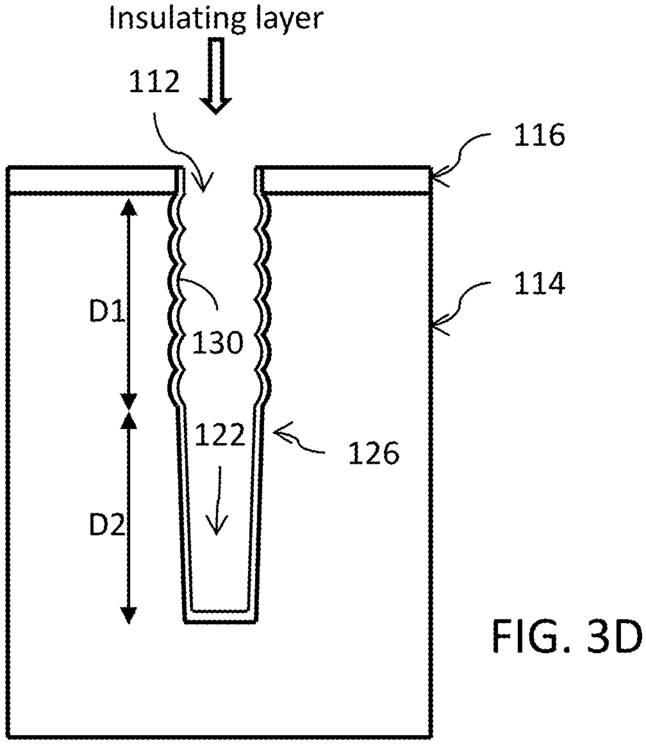

FIG. 3D—the overall trench 126 (combination of the first and second trench parts) produced by the RAP/Bosch process and RIE process is then lined (at the sidewalls and bottom) with an insulating layer 130. The insulating layer 130 may, for example, comprise an oxide or nitride material.

Figure 3E:
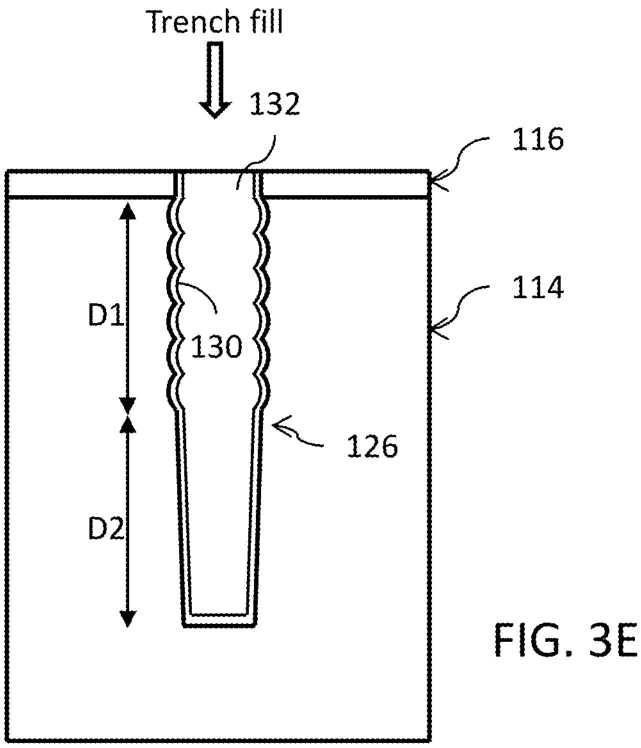

FIG. 3E—the trench 126 lined by the insulating layer 130 is then filled by a conductive material 132. The conductive material 132 may, for example, comprise polysilicon or a metal material. A planarization process (such as a chemical-mechanical polishing—CMP) may, for example, be used to remove excess fill material 132 located outside the trench and provide a planar upper surface. In connection with the CMP operation, the mask 126 may be stripped.

In a preferred implementation, the overall trench 126 is a high aspect ratio trench. By this it is meant a trench whose aspect ratio equals or exceeds 10:1 (depth:width).

The process illustrated in FIGS. 3A-3E shows the formation of a given trench with a given depth. Some circuit applications may require the formation of trenches have different depths. The process of FIGS. 3A-3E can be used to simultaneously form trenches of different depths as shown in FIGS. 4A-4E.

Figure 4A:
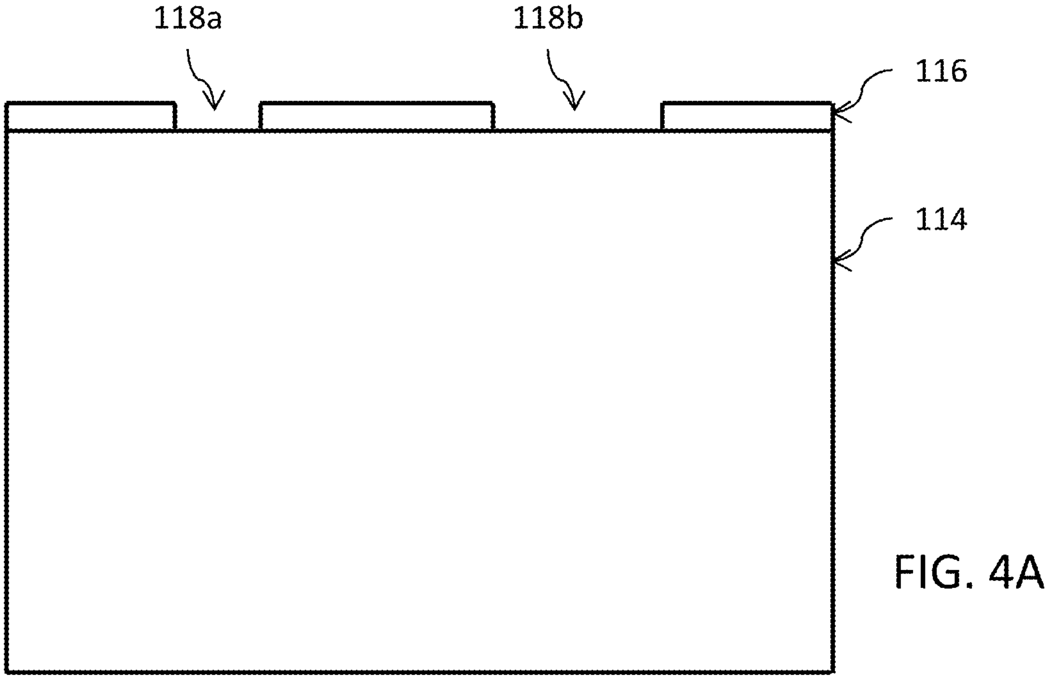
FIGS. 4A-4E illustrate steps in process for forming and filling two high aspect ratio trenches having different depths.

FIG. 4A—a hard mask 116 is formed on the upper surface of a semiconductor (for example, silicon) substrate 114 and patterned to include a mask openings 118*a* and 118*b* at the locations where it is desired to form a trench.

Figure 4B:
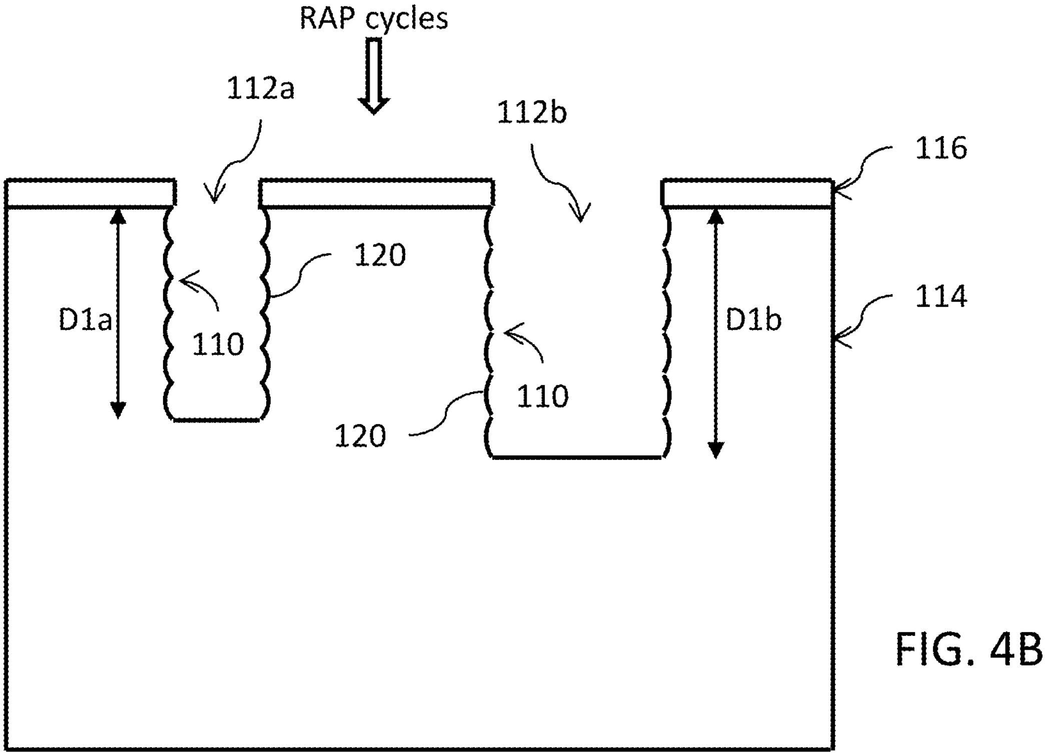

FIG. 4B—using a rapid alternating parameters (RAP) etch process, or a Bosch etch process, as is well known to those skilled in the art, repeated alternating etching and deposition cycles are performed in a first etch phase to open a first portion 112*a* of a first trench in the substrate 114 to a first depth D1*a* and open a respective first portion 112*b* of a second trench in the substrate 114 to a respective first depth D1*b*. It is noted that the RAP/Bosch etch process produces a trench sidewall surface roughness defined by scalloped features 110.

The etching cycles and the deposition cycles of the RAP/Bosch process may, for example, be implemented using the process recipe as described above in connection with FIG. 3B.

Figure 4C:
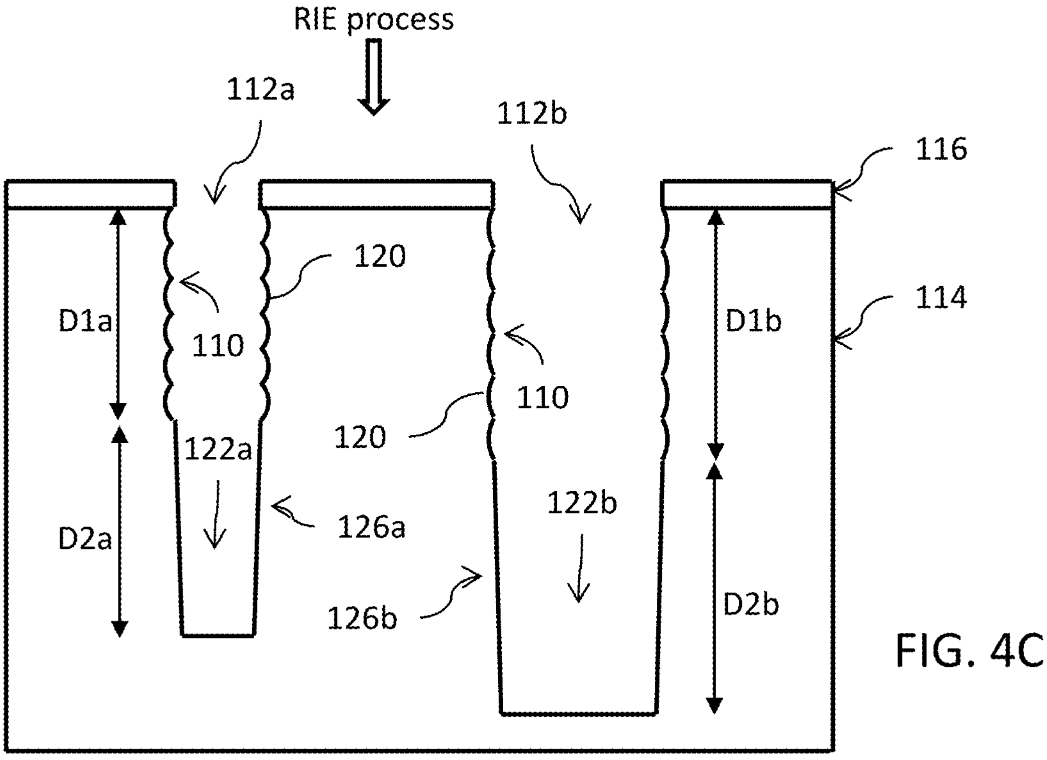

FIG. 4C—using a reactive ion etch (RIE) process in a second etch phase (subsequent to the first etch phase), a second portion 122*a* of the first trench is opened (extending from the bottom of the RAP/Bosch process first portion 112*a*) in the substrate 114 to a second depth D2*a* and a respective second portion 122*b* of the second trench is opened (extending from the bottom of the RAP/Bosch process respective first portion 112*b*) in the substrate 114 to a respective second depth D2*b*. The etch provided by the RIE process is anisotropic. The overall first trench 126*a* produced by the RAP/Bosch process and RIE process has a depth of D1*a*+D2*a* and the overall second trench 126*b* produced by the RAP/Bosch process and RIE process has a depth of D1*b*+D2*b*. It will be noted that the anisotropic RIE produces the second portions 122*a* and 122*b* with a substantially uniform (i.e., smooth) trench sidewall surface roughness.

The RIE process may, for example, be implemented using the process recipe as described above in connection with FIG. 3C.

Figure 4D:
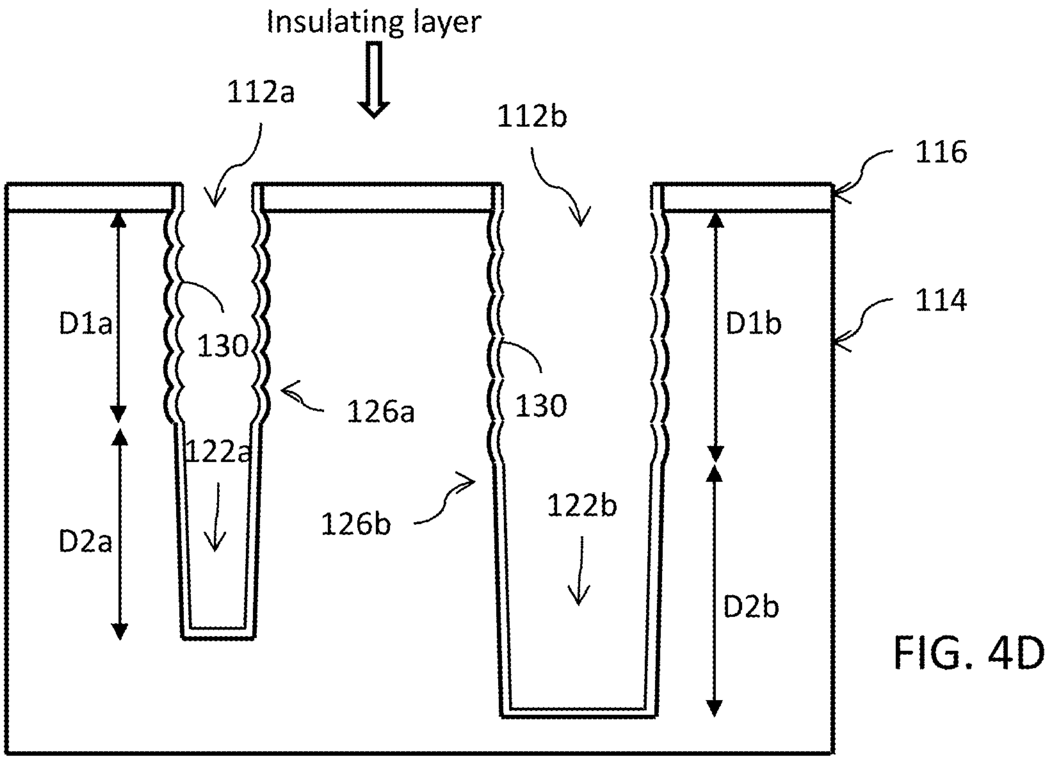

FIG. 4D—the first and second trenches 126*a* and 126*b* produced by the RAP/Bosch process and RIE process are then lined (at the sidewalls and bottom) with an insulating layer 130. The insulating layer 130 may, for example, comprise an oxide or nitride material.

In an embodiment, the insulating layer 130 may be selectively removed from the bottom of one of the first and second trenches. FIG. 4D illustrates removal from the bottom of the second trench 126*b*. This may be accomplished through use of a directional etch at the second trench 126*b* while the first trench 126*a* is protected.

Figure 4E:
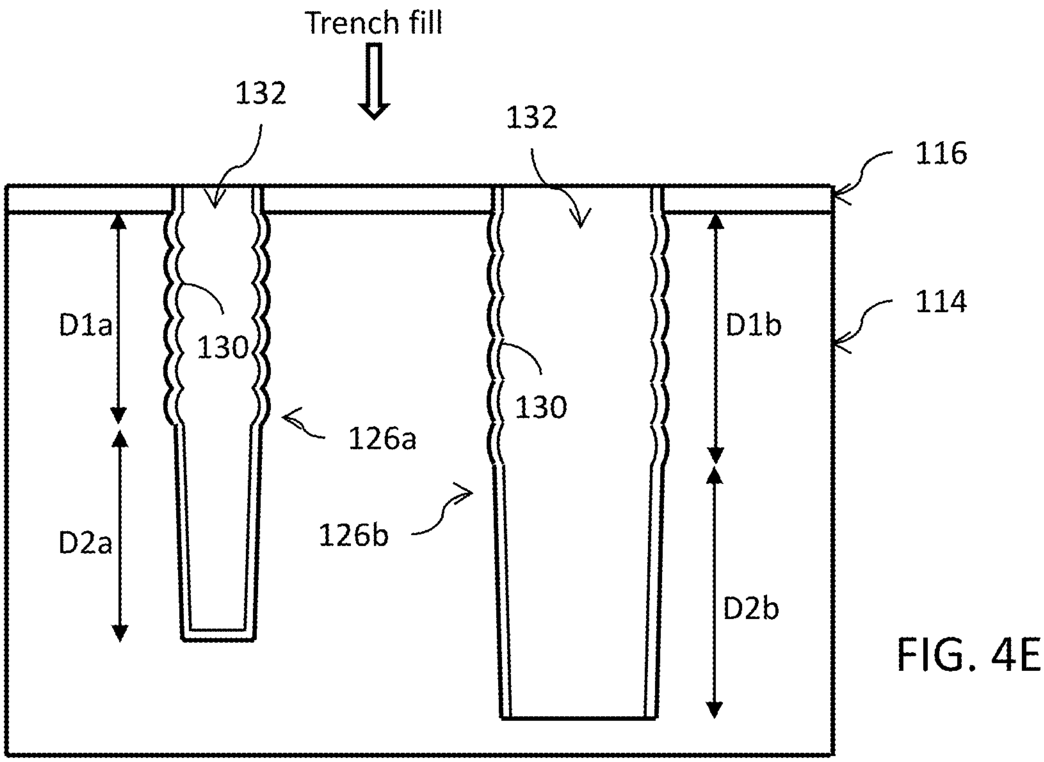

FIG. 4E—the first and second trenches 126*a* and 126*b* lined by the insulating layer 130 are then filled by a conductive material 132. The conductive material 132 may, for example, comprise polysilicon or a metal material. A planarization process (such as a chemical-mechanical polishing—CMP) may, for example, be used to remove excess fill material 132 located outside the trenches and provide a planar upper surface. In connection with the CMP operation, the mask 126 may be stripped.

It will be noted that the conductive material 132 in the first trench 126*a* is fully insulated from the substrate 114 by the insulating layer 130. Conversely, in the second 126*b*, where the insulating layer 130 has been selectively removed from the bottom of the second trench 126*b*, the conductive material 132 is laterally insulated from the substrate 114 by the insulating layer 130, but is in contact with the substrate 114 at the bottom of the second trench 126*b*. In this configuration, the first trench 126*a* may comprise a field plate structure, a capacitive deep trench isolation, or other type of insulated electrode structure, and the second trench 126*b* may comprise a substrate contact structure used for substrate biasing.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A method, comprising:

providing a semiconductor substrate having an upper surface; and forming a first trench extending into the semiconductor substrate from the upper surface;

wherein forming the first trench comprises:

in a first etch phase, performing a plurality of repeated alternating etching and deposition cycles to open a first portion of the first trench in the semiconductor substrate, said first portion of the first trench having a first depth; and in a second etch phase, subsequent to the first etch phase, performing a reactive ion etch to open a second portion of the first trench, extending from a bottom of the first portion of the first trench, in the semiconductor substrate, said second portion of the first trench having a second depth;

wherein performing the reactive ion etch comprises:

supplying a noble gas in a gas mixture for the reactive ion etch; and applying a negative bias voltage to the semiconductor substrate during the reactive ion etch; and wherein performing the reactive ion etch comprises an initial phase including flowing the gas mixture that includes $CHF_3$, $O_2$ and Ar but where no plasma power is applied.

2. The method of claim 1, further comprising:

lining sidewalls and a bottom of the first trench with an insulating layer; and then filling the first trench with a conductive material.

3. The method of claim 1, wherein the repeated alternating etching and deposition cycles of the first etch phase are part of one of a Bosch etching process or a rapid alternating parameters (RAP) etching process for trench formation.

4. The method of claim 1, wherein the noble gas is Ar.

5. The method of claim 1, wherein the negative bias voltage is in a range of 200-400 Volts.

6. The method of claim 1, wherein the gas mixture comprises a mixture of $SF_6$, $O_2$ and Ar.

7. The method of claim 1, further comprising applying a 0 Volts bias voltage to the semiconductor substrate during the initial phase.

8. The method of claim 1, wherein the first trench has an aspect ratio of at least 10:1.

9. The method of claim 1, further comprising forming a second trench, separate from the first trench, extending into the semiconductor substrate from the upper surface.

10. The method of claim 9, forming the second trench comprises:

in a respective first etch phase, performing a plurality of repeated alternating etching and deposition cycles to open a first portion of the second trench in the semiconductor substrate, said first portion of the second trench having a respective first depth; and in a respective second etch phase, subsequent to the respective first etch phase, performing a reactive ion etch to open a second portion of the second trench, extending from a bottom of the first portion of the second trench, in the semiconductor substrate, said second portion of the second trench having a respective second depth.

11. The method of claim 10, wherein first etch phase and the respective first etch phase are simultaneously performed, and wherein the second etch phase and the respective second etch phase are simultaneously performed.

12. The method of claim 9, wherein an overall depth of the first trench is smaller than an overall depth of the second trench.

13. A method, comprising:

providing a semiconductor substrate having an upper surface; and forming a first trench extending into the semiconductor substrate from the upper surface;

wherein forming the first trench comprises:

in a first etch phase, performing a plurality of repeated alternating etching and deposition cycles to open a first portion of the first trench in the semiconductor substrate, said first portion of the first trench having a first depth; and in a second etch phase, subsequent to the first etch phase, performing a reactive ion etch to open a second portion of the first trench, extending from a bottom of the first portion of the first trench, in the semiconductor substrate, said second portion of the first trench having a second depth;

wherein performing the reactive ion etch comprises:

supplying a noble gas in a gas mixture for the reactive ion etch; and applying a negative bias voltage to the semiconductor substrate during the reactive ion etch;

wherein the gas mixture comprises a mixture of $SF_6$, $O_2$ and Ar; and wherein the gas mixture comprises 35-55% $SF_6$, 25-40% $O_2$ and 15-30% Ar.

14. The method of claim 13, further comprising:

lining sidewalls and a bottom of the first trench with an insulating layer; and then filling the first trench with a conductive material.

15. The method of claim 13, wherein the repeated alternating etching and deposition cycles of the first etch phase are part of one of a Bosch etching process or a rapid alternating parameters (RAP) etching process for trench formation.

16. The method of claim 13, wherein the noble gas is Ar.

17. The method of claim 13, wherein the negative bias voltage is in a range of 200-400 Volts.

18. The method of claim 13, wherein the first trench has an aspect ratio of at least 10:1.

19. A manufacturing method of an electronic device comprising a semiconductor substrate having an upper surface and a first trench and second trench extending into the semiconductor substrate from the upper surface, wherein the second trench has a second depth in the semiconductor substrate greater than a first depth of the first trench in the semiconductor substrate, wherein the method comprises:

providing the semiconductor substrate;

in a first etch phase, performing a plurality of repeated alternating etching and deposition cycles to open a respective first portion of each of the first and second trenches, said respective first portion having a respective first depth;

in a second etch phase, subsequent to the first etch phase, performing a reactive ion etch to open a respective second portion of each of the first and second trenches, extending from a bottom of the respective first portion, said respective second portion having a respective second depth;

lining sidewalls and a bottom of each of the first and second trenches with an insulating layer;

removing the insulating layer from the bottom of the second trench, while leaving the insulating layer in place on the bottom of the first trench; and then, filling each of the first and second trenches with a conductive material.

20. The method of claim 19, wherein, in the first etch phase, the respective first portions of the first and second trenches are formed at the same time, and wherein, in the second etch phase, the respective second portions of the first and second trenches are formed at the same time.

21. The method of claim 19, wherein the repeated alternating etching and deposition cycles of the first etch phase are part of one of a Bosch etching process or a rapid alternating parameters (RAP) etching process.

22. The method of claim 19, wherein performing the reactive ion etch comprises:

supplying a noble gas in a gas mixture for the reactive ion etch; and applying a negative bias voltage to the semiconductor substrate during the reactive ion etch.

23. The method of claim 22, wherein the negative bias voltage is in a range of 200-400 Volts, and the gas mixture comprises 35-55% $SF_6$, 25-40% $O_2$ and 15-30% Ar.

24. A method, comprising:

providing a semiconductor substrate having an upper surface; and forming a first trench extending into the semiconductor substrate from the upper surface;

wherein forming the first trench comprises:

in a first etch phase, performing a plurality of repeated alternating etching and deposition cycles to open a first portion of the first trench in the semiconductor substrate, said first portion of the first trench having a first depth; and in a second etch phase, subsequent to the first etch phase, performing a reactive ion etch to open a second portion of the first trench, extending from a bottom of the first portion of the first trench, in the semiconductor substrate, said second portion of the first trench having a second depth;

wherein at least a part of the first portion of the first trench comprises scallops and wherein the second portion of the first trench is free from scallops.

25. The method of claim 24, wherein the reactive ion etch to open the second portion of the first trench is anisotropic along a direction perpendicular to the upper surface of the semiconductor substrate.

* * * * *